United States Patent [19]

Su et al.

[11] 3,969,634
[45] July 13, 1976

[54] BUCKET BACKGROUND SUBTRACTION CIRCUIT FOR CHARGE-COUPLED DEVICES

[75] Inventors: Stephen C. Su, Huntington Beach; Ronald M. Finnila, Costa Mesa, both of Calif.

[73] Assignee: Hughes Aircraft Company, Culver City, Calif.

[22] Filed: July 31, 1975

[21] Appl. No.: 601,124

[52] U.S. Cl................................ 307/221 D; 357/24
[51] Int. Cl.².................... G11C 19/28; H01L 29/78
[58] Field of Search............ 307/221 D, 221 C, 304; 357/24

[56] References Cited
UNITED STATES PATENTS

| | | | |
|---|---|---|---|
| 3,777,186 | 12/1973 | Chang | 357/24 X |
| 3,919,564 | 11/1975 | Walden | 307/221 D |

*Primary Examiner*—John S. Heyman
*Attorney, Agent, or Firm*—Donald C. Keaveney; W. H. MacAllister

[57] ABSTRACT

There is disclosed a circuit for removing the DC or background representing charge component of a signal to be passed through a charge coupled device shift register without degrading the information carried by the AC component of the signal. Such a circuit may, for example, be used to remove the constant background illumination component of the input from a semiconductor imaging device to increase the contrast ratio of the image signal. The circuit comprises two electrode defined potential wells or buckets formed in a semiconductor substrate with a control gate between them and a transfer gate which controls the flow of the charges in the first bucket to a P-N junction. Like the well defining electrodes, the control gate and transfer gate are electrodes separated from the semiconductor substrate by an insulation layer. The transfer gate functions as a channel switch to control the flow of the background charges from the first bucket through the P-N junction to an external drain in discrete quantized increments under the control of an appropriate clock voltage on the transfer electrode. This subtraction of the DC component from the signal passing through the shift register results in a reduction in the size of the storage electrodes required to transmit a given quantity of signal charge through the shift register for fixed clock voltages and thereby makes more economical use of the chip area.

6 Claims, 7 Drawing Figures

BUCKET BACKGROUND SUBTRACTION CIRCUIT FOR CHARGE-COUPLED DEVICES

BACKGROUND OF THE INVENTION

Charge coupled device signal processing circuitry is now being used in conjunction with focal plane arrays of infrared detectors to provide solid state imaging devices as may be seen from U.S. Pat. No. 3,883,437 issued May 13, 1975 to K. Nummedal et al. Charge coupled devices of more general application are shown by way of example in U.S. Pat. No. 3,801,883 issued to J. J. Tiemann on Apr. 2, 1974 and in U.S. Pat. No. 3,819,953 issued to C. M. Puckette et al on June 25, 1974. The basic concept of utilizing potential barriers formed under electrodes to control charge flow in such charge coupled devices has been recognized therein. Furthermore, where such devices are to be used in an imaging capacity, efforts have been made to provide "antiblooming" control circuits of the type illustrated in U.S. Pat. No. 3,863,065 issued on Jan. 28, 1975, to W. F. Kosonocky et al and in U.S. Pat. No. 3,866,067 issued Feb. 11, 1975, to J. F. Amelio. In Kosonocky a bus conductor separated from sensing regions by a potential barrier is utilized to remove excess charge generated in response to an optical overload at one particular location which causes an effect analogous to the blur from an intense light spot in a photographic image which is referred to as "blooming". Amelio deals with the same problem by providing charge transfer between a light sensing element and a charge sink region regulated to control the amount of charge allowed to accumulate in the sensing element. These and other antiblooming circuits, however, operate on a fixed potential barrier control and are directed to only one aspect of the exposure problem, namely the aspect of preventing localized high intensity signal from spilling over into adjacent areas and destroying the resolution of the image.

A different problem to which the present invention is directed is encountered when one records an image in an environment having a high steady state background component throughout the image such as is encountered when recording the infrared tail pipe pattern of an aircraft or missile against a background sky having high uniform infrared radiation therein. In this instance one is not primarily concerned with the excess intensity of the tail pipe radiation in the antiblooming sense, but rather with reducing the overall background or steady state component of signal so as to enhance the contrast ratio of the desired signal.

SUMMARY OF THE INVENTION

It is an object of this invention to provide means for subtracting the steady state, uniform, background or DC component of a signal from signals being processed through a charge coupled device shift register in order to enhance the signal information and in order to more efficiently utilize the shift register circuitry.

To this end a bucket background subtraction circuit (hereinafter BBS) is provided in the shift register which subtraction circuit consists of four electrodes and a difussed P-N junction. Two electrodes act as temporary storage capacitors for an incoming charge packet; one electrode controls the potential barrier between the two storage electrodes and the fourth electrode serves as a channel switch for draining out the charges in one storage well to the P-N junction. This circuit is operated to remove a fixed amount of charge from a packet of charge at the input or output end of a CCD shift register. In this manner the DC offset of a signal can be reduced in cases where capacitive coupling is not practical. This is particularly important in infrared imaging applications where the background gives rise to a large DC component in the signal from the detectors. By reducing the background or DC component of the signal, the size of the CCD shift register used for time delay and integration can be greatly reduced.

These and other objects, advantages and features of the invention will be more fully appreciated from the detailed description of the invention below taken together with the accompanying drawings wherein like reference characters refer to like parts throughout and in which;

FIG. 5b is a diagramatic illustration of the voltage waveform used in the operation of the circuit of FIG. 5a.

DETAILED DESCRIPTION

In charge coupled devices of the type shown in the above described prior art the charge storage capability of a potential well or bucket is directly proportional to the size of the storage electrode for a fixed clock voltage. Hence, if the input signal charge carries a large DC component representing a constant background in imaging devices, for example, the CCD bucket size has to be increased proportionally to accommodate a charge representing this constant background level. Since the noise ratio is in direct proportion to the area of the electrode, increasing electrode size to accommodate this background charge is a poor compromise in terms of signal to noise ratio at the output of the CCD. It is also an uneconomical use of chip area. Providing a coupling capacitor on the chip cannot effectively eliminate this background component since very large area capacitors are required for each input diode in frequency ranges of practical interest. Hence, it is desirable to introduce a more efficient way to subtract the DC component of a signal before inputting the signal into the shift register or (where feedback loops tend to build up such a charge level) at the output of the shift register or any suitable intermediate location.

Figure 1:
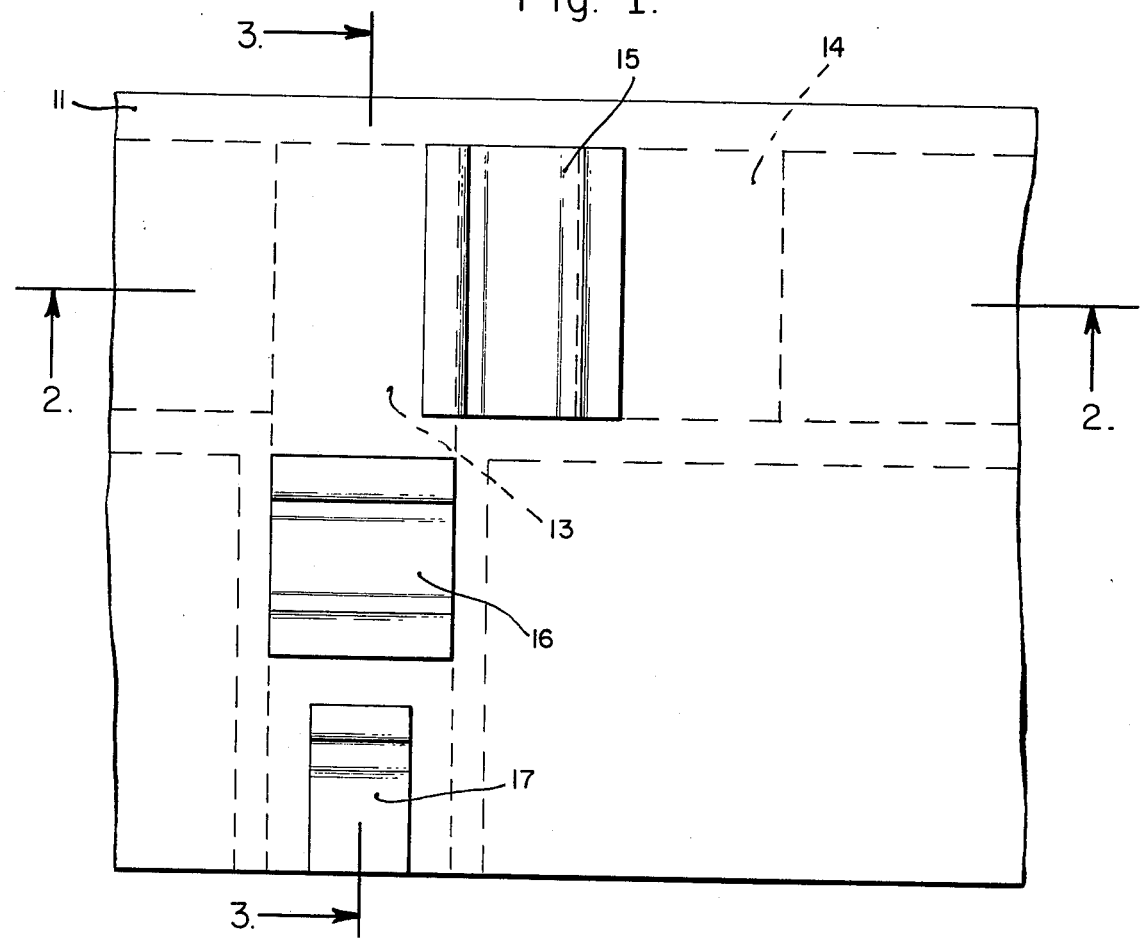
FIG. 1 is a schematic plan view of a semiconductor wafer in which the bucket background subtraction circuit is formed.
Figure 2:
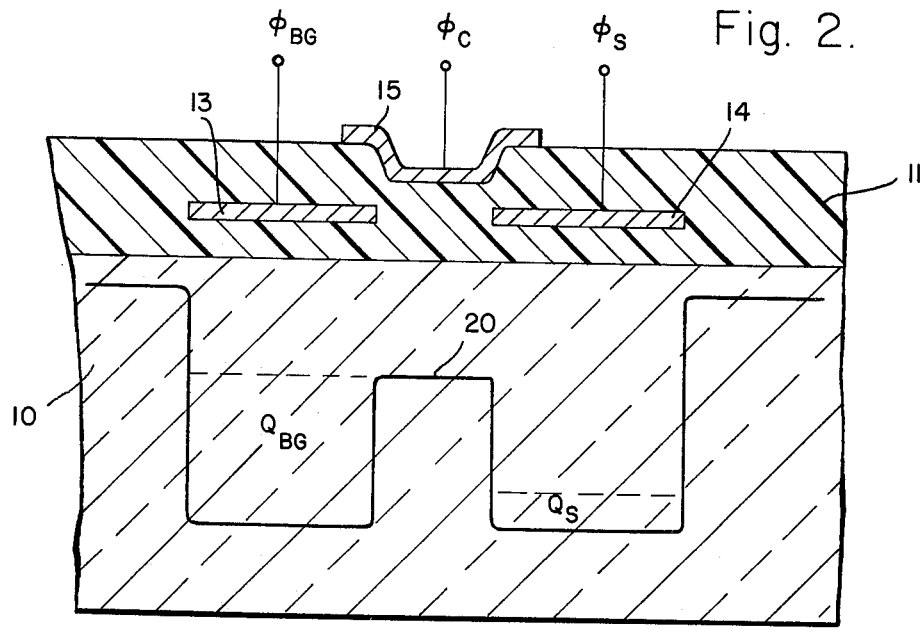
FIG. 2 is a sectional view on the line 2—2 of FIG. 1.
Figure 3:
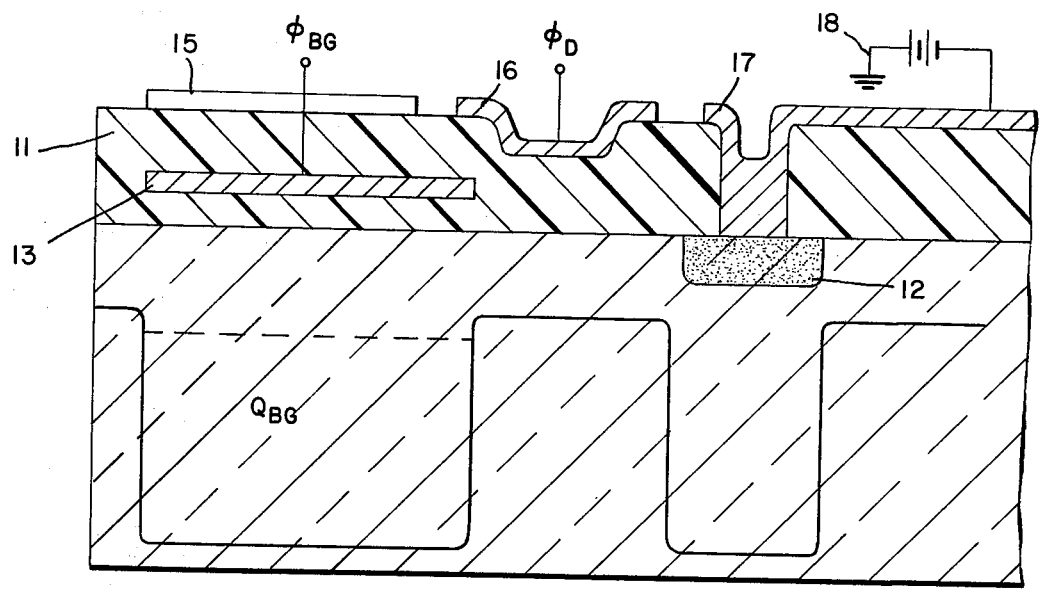
FIG. 3 is a sectional view on the line 3—3 of FIG. 1.

As may be seen from FIGS. 1, 2 and 3, the bucket background subtraction circuit basically consist of four electrodes 13, 14, 15 and 16 separated from a semiconductor substrate 10 by an insulating layer 11 and a diffused PN junction 12 which is formed in the semiconductor substrate 10. Substrate 10 may, for example, be N-type silicon doped to concentration of $10^{15}$ or $10^{16}$ $cm^{-3}$ with arsenic or phosphorus. Two electrodes act as temporary storage capacitors for incoming charge packets by forming two potential wells or buckets under the electrodes. As best seen in FIG. 2 these are the electrodes 13 and 14. A third electrode, 15 controls the potential barrier between the two storage electrodes and thus acts as a control gate for the transfer of the signal component of charge. The fourth electrode, 16, serves as a channel switch for draining out the background charges in the first storage well under electrode 13 to the PN junction 12 which in turn is provided with a contact metallization 17 connecting it to the negative side of a fixed voltage source 18, the other side of which is grounded. It will be noted from FIG. 1 that the electrodes 13 and 14 are normally aligned with the direction of input charge flow, the control electrode 15 being positioned between two adjacent sides of these rectangular juxtaposed electrodes. The channel switch or transfer electrode 16 controlling the flow of charge from the bucket under electrode 13 to the drain is aligned in a direction orthogonal to the normal direction of flow of input charge and is positioned adjacent to a second side of the first electrode 13 orthogonal to the first side thereof which is adjacent to electrode 15. The device thus has a generally T shaped configuration.

The circuit efficiently removes a fixed amount of charge from a packet of charge coming into the first bucket of potential well. In this way the DC offset of a signal is reduced in cases where capacitive coupling is not practical. The circuit is particularly useful in infrared imaging applications where the background gives rise to a large DC component in the signal from the detectors.

Figure 5A:
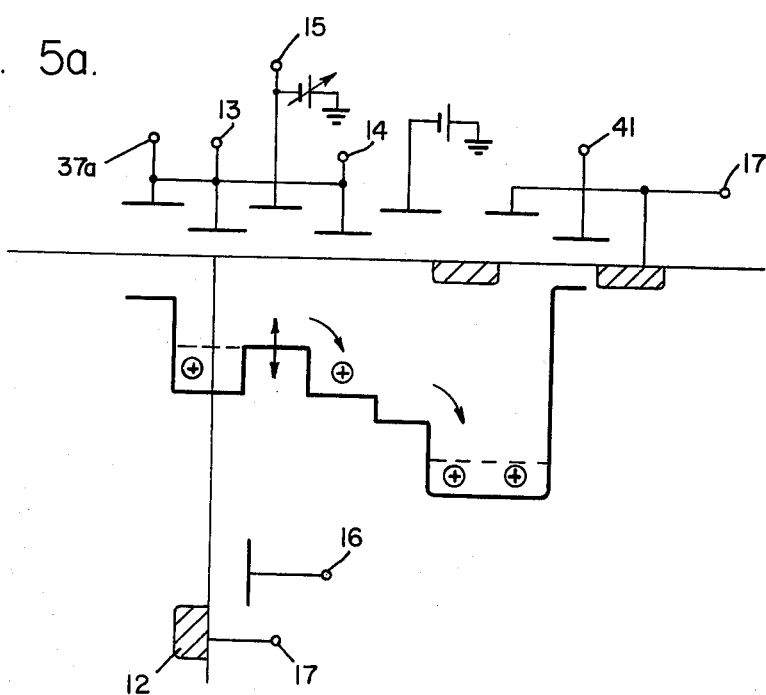
FIG. 5a is a similar schematic diagram illustrating the simplest way of implementing this mode of operation referred to as a static subtraction mode.
Figure 5B:
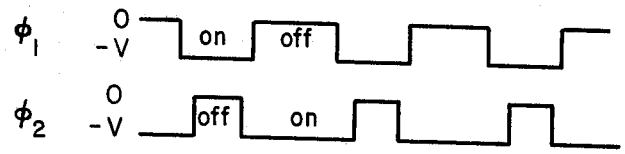

In FIG. 1 the voltage $\phi_{BG}$ is applied to electrode 13. The waveform of this voltage is shown as $\phi_2$ in FIG. 5b which assumes a two phase system. The voltage $\phi_S$ which is applied to electrode 14 is also equal to $\phi_2$. The control voltage between electrodes 13 and 14, which is applied to electrode 15, is designated as $\phi_C$ and may be a fixed DC bias. The voltage $\phi_1$ shown in FIG. 5b is applied to electrode 16 in FIGS. 1 and 3 and is indicated as $\phi_D$. This voltage controls the channel switching into the drain through diffusion electrode 17 which is connected to a negative bias. It will be noted that voltage waveform $\phi_1$ is overlapping but out of phase with the voltage $\phi_2$ applied to electrodes 13 and 14 to transfer the signal charge. In FIG. 1, $\phi_{BG}$ is applied to electrode 13 which is the background charge temporary storage electrode and $\phi_S$ is applied to electrode 14 which is the output signal storage electrode. The voltage $\phi_C$ applied to electrode 15 sets up a potential barrier between the BG well and the signal well which may be most clearly seen as the barrier 20 in FIG. 2. When a packet of charges ($Q_{IN}$) flows toward the BG well from the left it will first fill up the BG well in the normal way with charge designated as $Q_{BG}$ until the surface potential of the filled well is equal to that of the barrier potential 20. Additional input charges designated as $Q_S$ will spill over the potential barrier 20 and will be collected in the signal storage well under electrode 14 as shown in FIG. 2. By varying the height of potential barrier 20, one can control the amount of $Q_S$ to be sensed as output signal by a floating diffusion downstream in the shift register. For a fixed BG well charge storage capacity, it is essential to set up a proper barrier by the control voltage $\phi_C$ such that the $Q_{BG}$ portion of the input charge consists of only the DC component and that all desired signal charge is permitted to pass over the barrier. If the potential barrier is too high, clipping of the AC component will occur. If the potential barrier continues to rise, a point will be reached when no output signal can be detected. In other words, the voltage level at $\phi_C$ can control the linearity as well as the amount of output signal charge.

It is essential to set $\phi_C$ at such a voltage level that $Q_{IN}$ equals $Q_{BG}$ plus $Q_S$ with $Q_S$ containing at least the complete AC component of the input signal charge. $Q_{BG}$ in the meantime will be clocked to the P-N drain junction 12 and electrode 17 by $\phi_D$ which is applied to electrode 16 while $Q_S$ can be shifted downstream in the shift register and be sensed by a floating diffusion in the conventional way. This thus provides a very efficient way of reducing the channel area. For example, if 80% of the background charge can be subtracted by the BBS circuit shown herein before inputting to the CCD shift register, a reduction of 80% of storage electrode area of the CCD shift register is achieved. It should be noted that the operation of this basic circuit does not depend upon an unusually high signal point overflowing a fixed potential barrier as in the antiblooming devices discussed above, but rather depends upon a control voltage establishing a potential barrier which is below the minimum DC level of the AC component so that the DC background uniformly present in the input charge can be clocked out in predetermined discrete or quantized amounts.

Figure 4:
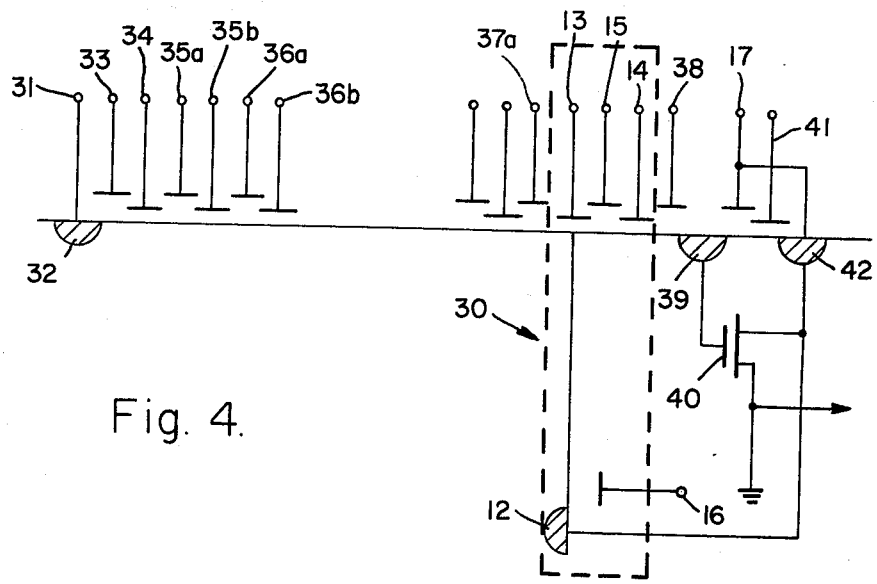
FIG. 4 is a schematic diagram illustrating a four-bit CCD shift register with a BBS circuit near its output end.

There are principally two different modes of operating the BBS circuit. The first of these modes is conveniently referred to as the static subtraction mode and is illustrated in FIGS. 4, 5a and 5b. The second of these is conveniently referred to as the dynamic subtraction mode and is discussed in connection with FIG. 6. In both modes, for a fixed potential barrier under $\phi_C$, the amount of background charge that can be subtracted by the BBS circuit depends on the empty well potential under $\phi_{BG}$ and upon the size of the $\phi_{BG}$ electrode. The effect of the clocking frequency $\phi_D$ distinguishes the two modes. The subtraction of background charge which takes place at the same frequency as the clock frequency of the CCD shift register is referred to as the static subtraction mode and that which takes place at a higher frequency is referred to as the dynamic subtraction mode. This frequency of the subtraction cycle is controlled by the frequency of the voltage $\phi_D$ applied to electrode 16. The first mode can be applied at either the input or, if more convenient in a feedback loop type circuit, at an intermediate point or the output end of a shift register, while the latter or dynamic mode is utilized only at the input end as between an infrared detector and a CCD shift register. The operating principles of the two modes are as follows.

There is shown in FIG. 4 a schematic diagram of a four bit CCD shift register with a BBS circuit 30 near the output end which is suitable for operation in the subtraction mode. The simplest way of implementing this mode of operation using this circuit is shown in FIGS. 5a and 5b. In FIG. 4 an input voltage for charge signal is applied to electrode 31 which is connected to diffused junction 32. Electrodes 33 and 34 are respectively the surface metal electrode and the buried metal electrode for the input voltage. Thereafter alternate pairs of electrodes occur in sequence. These are respectively the surface metal and buried metal electrodes such as 35a and 35b for the $\phi_2$ clock voltage and the surface metal and buried metal electrodes of the next pair, 36a and 36b, for the $\phi_1$ clock voltage. The shift register extends the necessary length down to electrode 37a which is the first of a pair of electrodes to which the $\phi_2$ clock voltage shown in FIG. 5b is to be applied. The next electrode of this pair constitutes the background bucket electrode 13 for the BBS circuit 30 which is entirely like that shown in FIGS. 1, 2 and 3. A conventional output stage is used including a screen electrode 38 controlling the charge flow to a diffused junction 39 which connects output signal through transistor 40 to the output terminal. A reset terminal 41 cooperating with diffused junction 42 is conventionally provided.

In this arrangement, the potential $\phi_C$ on electrode 15 is controlled by a variable DC voltage source and no additional clock generator is needed. Since $\phi_2$ and $\phi_1$ are overlapping pulses, $Q_{BG}$ is being clocked to the diffused junction and its associated drain by voltage $\phi_D$ applied to electrode 16 before the pulse $\phi_2$ is turned off. $Q_{BG}$ will not overflow to the $Q_S$ bucket under electrode 14 in the push clock or static subtraction mode as long as $\phi_1$ turns on before $\phi_2$ turns off and the amplitude of $\phi_1$ is greater than or equal to the control voltage $\phi_C$ on electrode 15. The output screening electrode 38 should always be biased higher than $\phi_C$ to insure correct charge flow direction for the signal charge $Q_S$. In addition, if a separate clock pulse in phase with the $\phi_2$ is used on electrode 13, one can increase the subtracted amount by increasing the pulse amplitude of this separate pulse.

Figure 6:
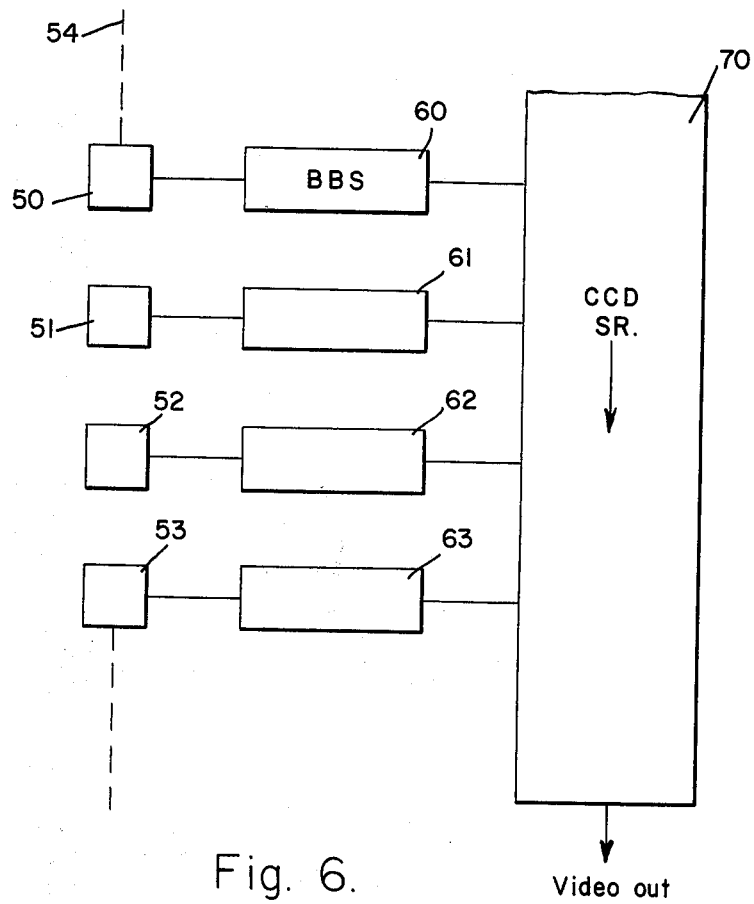
FIG. 6 is a block diagram illustrating the manner in which a BBS circuit may be used in an imaging device in what is referred to as the dynamic subtraction mode.

In FIG. 6 there is shown a block diagram of the manner of applying the BBS circuit in its dynamic subtraction mode which assumes an extremely high background imaging environment. In such an environment the AC signal charge can be as small as a fractional percentage of the total background charges. As illustrated in FIG. 6 a plurality of infrared detectors, 50, 51, 52 and 53 by way of example, are mounted in the focal plane 54 of an infrared imaging device. Of course it will be understood that a much larger number of detectors is in fact used and that the showing in FIG. 6 is essentially schematic. Each detector is connected through an associated BBS circuit to the CCD shift register 70 which provides a word output for the imager. Thus, BBS 60 connects the output of imager 50 to shift register 70 and similarly 61 connects 51, 62 connects 52, and 63 connects to 53.

In order to subtract as high as 99% or more of the total input charges with a reasonable bucket size for each detector element, it would be advantageous to clock $\phi_D$, the drain control voltage on each of BBS circuit, at a frequency, $f_D$, much higher than and an integral multiple of the clock frequency, $f_C$, of the CCD shift register. Since the background charge is much larger than the signal charge for every imager, the rate of filling the background storage bucket will be the same for all imagers. Only the small amount of overflow depends on the AC signal amplitude. The total amount of subtracted background charge is a constant for every imager and this constant is given by the expression $Q_{BG}$ is approximately equal to $f_D f_C (A_{BG}) (\Delta V) C_0$ where $f_D$ is equal to the clock frequency of $\phi_D$, $f_C$ is equal to the clock frequency of the CCD shift register, $A_{BG}$ is equal to the area of the background storage bucket, and $\Delta V$ equals the surface potential difference between the control barrier and the empty background bucket. In this dynamic subtraction mode the total signal charge collected under the signal electrode of each BBS circt is a summation of the signal charges coming from each overflow operation. During every cycle of frequency $f_D$ the same amount of background charge is clocked to the BBS drain junction while a signal charge is being collected under the signal electrode. The term $f_D/f_C$ is a measure of the number of such incremental signal charges being collected before they are clocked out of the signal storage bucket into the word shift register 70. The total signal charge shifted downstream of the CCD shift register 70 is $Q_S$ equals $(f_D/f_C) Q_{Si}$ where $Q_{Si}$ is the overflow from the background bucket during each $f_D$ cycle. This overflow varies with the AC signal amplitude. Note that this subtraction mode only operates satisfactorily when the AC signal component is much less than the DC background charge such that the rate of filling the background storage bucket is independent of the AC signal amplitude. Otherwise the background charge from the imager is not constant, which in turn results in a noise component introduced into the CCD shift register.

Of course, it is to be understood that which mode of application is to be preferred depends upon the overall system application in which the circuit is used. In either event there is provided a simple charge coupled device circuit which efficiently removes a fixed amount of charge from a packet of charges in order to reduce the DC offset of a signal by a quantized predetermined controllable amount which is advantageously used in cases where capacitive coupling is not practical.

What is claimed is:

1. A charge coupled device circuit for removing a predetermined quantum of charge from a packet of charge in a charge coupled device plural phase clock voltage driven shift register to reduce the DC offset component of a signal passing through said shift register, said circuit comprising:
   a. a semiconductor substrate;
   b. an insulation layer on said substrate;
   c. a diffused junction charge drain means in said substrate;
   d. first and second juxtaposed charge storage locations in said substrate respectively having first and second electrode means associated therewith, each said electrode means being spaced by said insulation from said substrate and being positioned to define a potential well in said substrate for charge storage;
   e. means to supply input charge to a first side of said first charge storage location;
   f. signal control means comprising a third electrode positioned for controlling the potential barrier between a second side of said first charge storage location and a first side of said second charge storage location for extracting the AC signal representing variable magnitude component of charge from said first charge storage location and transferring it to said second charge storage location; and,
   g. channel switch means comprising a fourth electrode positioned for controlling the potential barrier between said diffused junction charge drain means and a third side of said first charge storage location which is juxtaposed to said diffused junction charge drain means for extracting the DC uniform background representing component of charge from said input charge in said first charge storage location by transfer through said diffused junction charge drain means.

2. A device as in claim 1 and further including means for supplying a DC voltage of adjustably fixed magnitude to said third electrode to control the potential level above which said signal representing variable magnitude component of charge is extracted from said first charge storage location to said second charge storage location.

3. A device as in claim 1 and further including:
   a. means to apply a first phase of said drive clock of said shift register to said fourth electrode;
   b. means to apply a second phase of said drive clock of said shift register to both said first and second electrodes; and
   c. said first and second phases of said drive clock each being a train of rectangular pulses and each having the same repetition frequency, but said second phase being 180 degrees out of phase with said first phase at their respective pulse center points and said second phase being assymetrically shaped to overlap its on and off points with the on and off points of said first phase.

4. A device as in claim 2 and further including
   a. means to apply a first phase of said drive clock of said shift register to said fourth electrode;
   b. means to apply a second phase of said drive clock of said shift register to both said first and second electrodes; and
   c. said first and second phases of said drive clock each being a train of rectangular pulses and each having the same repetition frequency, but said second phase being 180 degrees out of phase with said first phase at their respective pulse center points and said second phase being assymetrically shaped to overlap its on and off points with the on and off points of said first phase.

5. A device as in claim 1 and further including:
   a. means to apply a first phase of said drive clock of said shift register to said fourth electrode;
   b. means to apply a second phase of said drive clock of said shift register to both said first and second electrodes; and
   c. said first and second phases of said drive clock each being a train of rectangular pulses, the frequency of said first phase being an integral multiple of the frequency of said second phase.

6. A device as in claim 2 and further including:
   a. means to apply a first phase of said drive clock of said shift register to said fourth electrode;
   b. means to apply a second phase of said drive clock of said shift register to both said first and second electrodes; and
   c. said first and second phases of said drive clock each being a train of rectangular pulses, the frequency of said first phase being an integral multiple of the frequency of said second phase.

* * * * *